(12) United States Patent
Pan et al.

(10) Patent No.: US 12,132,391 B2
(45) Date of Patent: Oct. 29, 2024

(54) POWER CONVERTER HAVING A GATE DRIVE CIRCUIT AND METHOD OF OPERATING

(71) Applicant: GENERAL ELECTRIC COMPANY, Schenectady, NY (US)

(72) Inventors: Di Pan, Schenectady, NY (US); Yichao Zhang, Guilderland, NY (US); Yuntao Xu, Clifton Park, NY (US); Yukai Wang, Glenville, NY (US)

(73) Assignee: General Electric Company, Evendale, OH (US)

( * ) Notice: Subject to any disclaimer, the term of this patent is extended or adjusted under 35 U.S.C. 154(b) by 0 days.

(21) Appl. No.: 18/453,629

(22) Filed: Aug. 22, 2023

(65) Prior Publication Data

US 2023/0396147 A1 Dec. 7, 2023

Related U.S. Application Data

(63) Continuation of application No. 17/401,402, filed on Aug. 13, 2021, now Pat. No. 11,831,232.

(51) Int. Cl.
*H02M 1/08* (2006.01)
*H02M 7/487* (2007.01)
*H02M 7/5395* (2006.01)

(52) U.S. Cl.
CPC ............. *H02M 1/08* (2013.01); *H02M 7/487* (2013.01); *H02M 7/5395* (2013.01)

(58) Field of Classification Search
CPC ...... H02M 1/08; H02M 1/0096; H02M 7/487; H02M 7/5395; H03K 17/04206; H03K 17/04; H03K 17/12; H03K 17/122
See application file for complete search history.

(56) References Cited

U.S. PATENT DOCUMENTS 6,271,709 B1   8/2001   Kimura et al.
8,471,584 B2   6/2013   Soldi et al.
(Continued)

FOREIGN PATENT DOCUMENTS

CN   109774465 A   5/2019
EP     2871765 A1   5/2015
(Continued)

OTHER PUBLICATIONS

Jiangbiao He et al, "An Improved PWM Strategy for "SiC+Si" Three-Level Active Neutral Point Clamped Converter in High-Power High-Frequency Applications", 2018 IEEE, pp. 5235-5239, 978-1-4799-7312-5/18.
(Continued)

*Primary Examiner* — Jue Zhang
*Assistant Examiner* — Jye-June Lee
(74) *Attorney, Agent, or Firm* — McGarry Bair PC

(57) ABSTRACT

A power converter apparatus comprises a set of switching elements communicatively coupled with a set of gate drive circuits. Each gate drive circuit is configured to provide a respective drive signal to a corresponding switching element, each switching element being switchably responsive to the respective drive signal. The apparatus includes a controller module configured to control an output state of the power converter, and selectively change one of a respective gate resistance and a respective gate current of a corresponding subset of the gate drive circuits based on the output state of the power converter.

20 Claims, 7 Drawing Sheets

(56) References Cited

U.S. PATENT DOCUMENTS

| | | | |
|---|---|---|---|
| 8,929,114 B2 | 1/2015 | Li et al. | |
| 9,543,855 B2 | 1/2017 | Soeiro et al. | |
| 10,291,150 B1 | 5/2019 | Zhang et al. | |
| 10,432,186 B2 | 10/2019 | Yang | |
| 10,547,251 B1 | 1/2020 | Pan et al. | |
| 10,727,729 B2 | 7/2020 | Nakashima et al. | |
| 10,778,032 B2 | 9/2020 | Ghosh et al. | |
| 11,831,232 B2 * | 11/2023 | Pan | H02M 7/5395 |
| 2015/0372615 A1 * | 12/2015 | Ayyanar | H02M 7/48 363/131 |

FOREIGN PATENT DOCUMENTS

| | | | |
|---|---|---|---|
| JP | 2010098820 A * | 4/2010 | |
| JP | 2016034178 A * | 3/2016 | |
| JP | 2016052198 A | 4/2016 | |
| JP | 2019009846 A * | 1/2019 | |
| JP | 2019129545 A | 8/2019 | |
| KR | 20200126275 A | 11/2020 | |
| KR | 20210028363 A | 3/2021 | |
| WO | 2014088551 A1 | 6/2014 | |
| WO | WO-2022176373 A1 * | 8/2022 | |

OTHER PUBLICATIONS

D. Zhang, J. He, D. Pan, M. Schutten and M. Dame, "High Power Density Medium-Voltage Megawatt-Scale Power Converter for Aviation Hybrid-Electric Propulsion Applications," 2019 IEEE Energy Conversion Congress and Exposition (ECCE), 2019, pp. 582-588, doi: 10.1109/ECCE.2019.8912809.

* cited by examiner

POWER CONVERTER HAVING A GATE DRIVE CIRCUIT AND METHOD OF OPERATING

STATEMENT REGARDING FEDERALLY SPONSORED RESEARCH AND DEVELOPMENT

This invention was made with Government support under contract number awarded by the National Aeronautics and Space Administration (NASA). The Government has certain rights in the invention.

CROSS REFERENCE TO RELATED APPLICATION(S)

This application claims priority to and benefit of U.S. patent application Ser. No. 17/401,402, filed Aug. 13, 2021, now U.S. Pat. No. 11,831,232, issued Nov. 28, 2023, which is incorporated herein in its entirety.

TECHNICAL FIELD

This disclosure relates to a power converter and a method of operating a power converter, and more specifically to an active gate drive circuit for a power converter.

BACKGROUND

Conventional power converters such as three-level active neutral-point clamped (ANPC) converters, are employed to convert a direct current (DC) power to an alternating current (AC) power having a three-level output. These ANPC converters employ a set of switches to aid in the power conversion. Typically, ANPC converters that employ silicon carbide (SiC) switches such as SiC metal-oxide-semiconductor field-effect transistors (MOSFETs) or insulated-gate bipolar transistors (IGBTs) are used when it is desirable to withstand a high voltage or high power. Each switch can be operated or toggled by a respective gate drive circuit which can selectively provide a control signal to a gate terminal of the switch to transition the switch between conducting and non-conducting states.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

Figure 1:
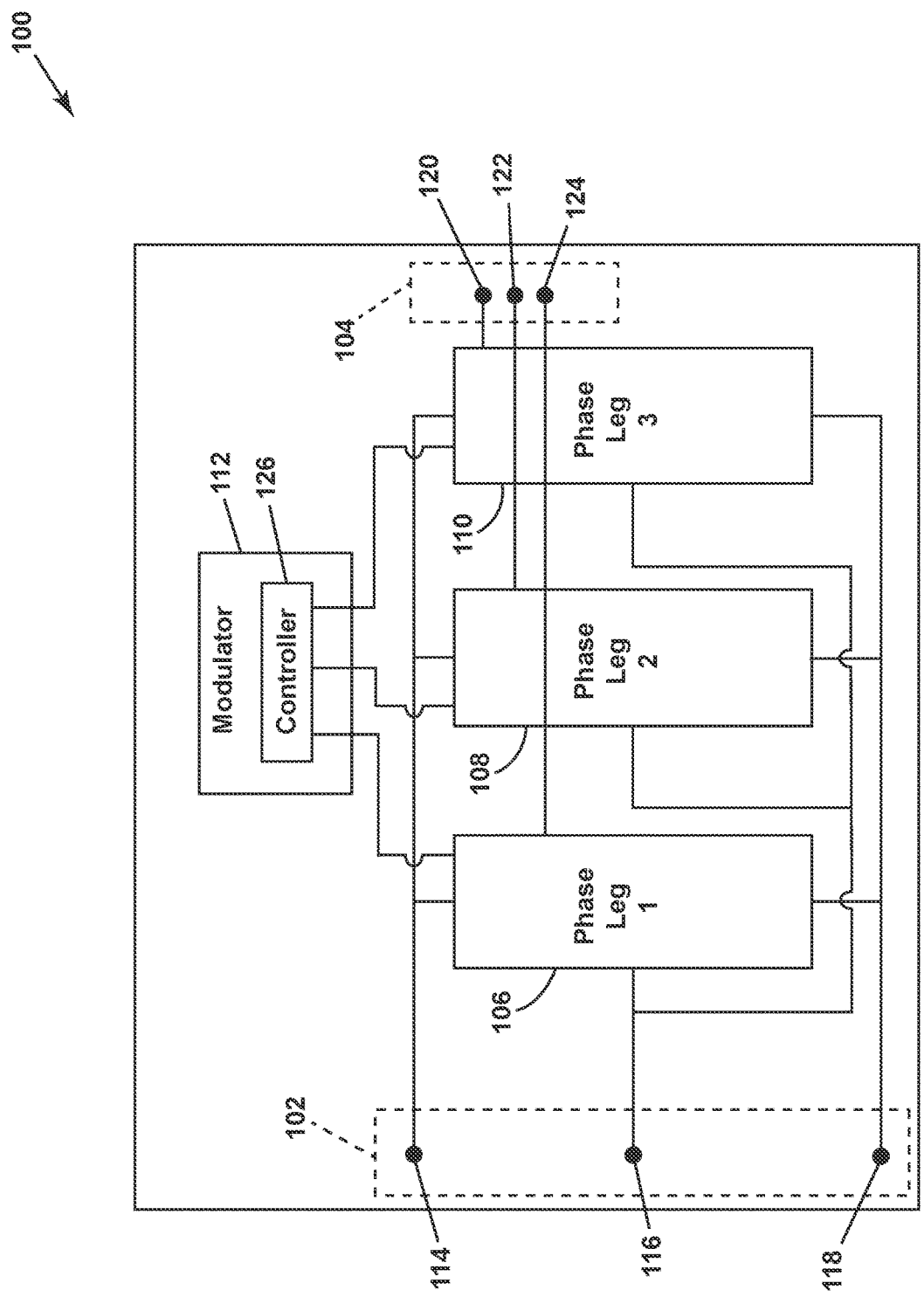
FIG. 1 is a block diagram of a three-level ANPC converter, in accordance with various aspects described herein.

Aspects of the disclosure can be implemented in any environment, apparatus, or method for in a circuit regardless of the function performed by the circuit.

As used herein, the term "set" or a "set" of elements can be any number of elements, including only one. Additionally, while terms such as "voltage", "current", and "power" can be used herein, it will be evident to one skilled in the art that these terms can be interrelated when describing aspects of the electrical circuit, or circuit operations. Thus, as used herein, the term "power" can be representative of a voltage, a current, or both the voltage and current.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads applied to the bus. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

As used herein, a "controller" or "module", for example, "controller module", or "switching module" can include a component configured or adapted to provide instruction, control, operation, or any form of communication for operable components to affect the operation thereof. Such controllers or modules can include any known processor, microcontroller, or logic device, including, but not limited to: Field Programmable Gate Arrays (FPGA), a Complex Programmable Logic Device (CPLD), an Application-Specific Integrated Circuit (ASIC), a Full Authority Digital Engine Control (FADEC), a Proportional Controller (PC), a Proportional Integral Controller (PI), a Proportional Derivative Controller (PD), a Proportional Integral Derivative Controller (PID), a hardware-accelerated logic controller (e.g. for encoding, decoding, transcoding, etc.), the like, or a combination thereof. While described herein as comprising separate elements, in non-limiting aspects such controllers and modules can be incorporated on one or more devices including a common device, such as a single processor or microcontroller. Non-limiting examples of such controllers or module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module, or switching module can also include a data storage component accessible by the processor, including memory, whether transition, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, Universal Serial Bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to affect a functional or operable outcome, as described herein.

Although various non-limiting aspects are depicted and described herein using various switching devices including MOSFETS or IGBTs or a combination thereof, other aspects are not so limited. Other non-limiting aspects can include any desired switching device that can switch a state between a low resistance state and a high resistance state in response to an electrical signal. For example, the switching devices in various aspects can comprise, without limitation, any desired type of switching element including for example, transistors, gate commutated thyristors, field effect transistors (FETs), IGBTs, MOSFETs, gate turn-off thyristors, static induction transistors, static induction thyristors, or combinations thereof, and combinations thereof.

The exemplary drawings are for purposes of illustration only and the dimensions, positions, order and relative sizes reflected in the drawings attached hereto can vary. Furthermore, the number of, and placement of, the various components depicted in the Figures are also non-limiting examples of aspects associated with the disclosure. For example, while various components have been illustrated with relative position of etc., aspects of the disclosure are not so limited, and the components are not so limited based on their schematic depictions.

A power converter is a power supply or power processing circuit that converts an input voltage waveform into a specified output voltage waveform. Controllers associated with the power converters manage an operation thereof by selectively controlling the conduction periods of switches employed therein. The switches employed by the power converter are typically semiconductor switching devices (e.g., MOSFETs, IGBTs, etc.).

In combination with the controller, a drive circuit (for example, a gate drive circuit) is conventionally employed to selectively provide a drive signal to a control terminal (e.g., a gate terminal) of each semiconductor switch to control an operation thereof in response to a command signal (for example, a pulse-width modulated (PWM) signal) from the controller.

Conventional power converters, such as active neutral point clamped (ANPC) converters, are widely used in AC drives and flexible AC transmission systems. When an ANPC converter is used, for example, in an inverter operation, a DC-link voltage can be converted into a variable alternating voltage and variable frequency. In contrast to a conventional half-bridge type converter having a two-level voltage output, ANPC converters can include an additional voltage level at the output. For example, the output voltage can include positive DC (DC+), negative DC (DC−), and can be a voltage output of zero or neutral.

Typical ANPC converters employ silicon carbide (SiC) switches such as MOSFETs when it is desirable to withstand a high voltage. As will be appreciated, SiC MOSFETs switch relatively faster in comparison to other switches, such as IGBTs, thereby resulting in relatively lower switching losses. However, the faster switching speed of the SiC MOSFETs can also lead to higher voltage stress across the SiC MOSFETs employed in conventional ANPC converters due to a commutation loop inductance.

As will be described in detail herein, various non-limiting aspects of an apparatus device and method for operating a phase-leg of a power converter such as an active neutral point clamped (ANPC) converter are presented. Use of the apparatus and method can result in improved operating efficiency and operational life for an ANPC converter. In particular, the apparatus and methods enable selectively increasing and decreasing a gate resistance of a gate drive circuit (for example a turn on resistance and a turn off resistance) for a corresponding semiconductor switch of the ANPC converter, to thereby reduce voltage stresses, for example during a zero-cross of a PWM command signal to the respective gate drive circuit. Moreover, the apparatus and methods enable selectively increasing or decreasing the switching speed of the semiconductor switches of the ANPC converter based on a state or mode of the converter, to thereby reduce voltage stresses across the switches. Consequently, the life-time and the reliability of the ANPC converter can be improved.

FIG. 1 is a block diagram of a three-level ANPC power converter 100, in accordance with aspects of the present disclosure. In non-limiting aspects, the power converter 100 can comprise an inverter that operates to convert a direct current (DC) power to an alternating current (AC) power. In an aspect, the power converter 100 includes an input port 102, an output port 104, and a set of phase-legs 106, 108, 110 disposed between the input port 102 and the output port 104. Additionally, the power converter 100 can also include a modulator 112 communicatively coupled to the set of phase-legs 106, 108, 110.

The input port 102 can include a positive input terminal 114, a neutral input terminal 116, and a negative input terminal 118. The positive input terminal 114, neutral input terminal 116, and negative input terminal 118 can be hereinafter collectively referred to as input terminals 114-118. The positive input terminal 114 can be maintained at a positive voltage, the negative input terminal 118 can be maintained at a negative voltage, and the neutral input terminal 116 can be maintained at a neutral voltage. In non-limiting aspects, the positive voltage and the negative voltage can be non-zero potentials while the neutral voltage can be a zero potential or substantially close to a zero potential. In some aspects, the neutral voltage can also be a non-zero potential. The input terminals 114-118 are electrically coupled to input terminals (see FIG. 2) of each of the phase-legs 106-110.

In the example of FIG. 1, a three-phase output voltage can be available at the output port 104 of the power converter 100. The output port 104 includes output terminals 120, 122, 124 to supply the three-phase output voltage to any target electronic device (not shown) or load coupled to the power converter 100. More particularly, a single-phase voltage can be supplied via each of the output terminals 120, 122, 124. These output terminals 120, 122, 124 can be hereinafter collectively referred to as output terminals 120-124. In some aspects, output terminals 120-124 of the output port 104 are electrically coupled to an output terminal (see FIG. 2) of each of the phase-legs 106-110. The output voltage at each of the output terminals 120-124 includes three levels such as a first level, a second level, and a neutral level.

By way of example, the first level can be a positive voltage level, while the second level can be a negative voltage level. By way of another example, while the first level can be the negative voltage level, the second level can be the positive voltage level. Moreover, the neutral level can be a zero voltage or substantially close to a zero voltage. In certain aspects, the neutral level can be a non-zero voltage.

The phase-legs 106, 108, 110 are electrically coupled to the input port 102 and the output port 104. Each of the phase-legs 106, 108, 110 is configured to convert the DC power received from the input port 102 to an AC power and supply the generated AC power to the output port 104 as a phase voltage and a phase current. More particularly, the phase-legs 106, 108, 110 are coupled to a corresponding output terminal 120, 122, 124 to provide the generated AC power thereto. In some aspects, one or more of the phase-legs 106-110 can include a set of switches (see FIG. 2) arranged to switchably convert the DC power to the AC power.

The modulator 112 is communicatively coupled to the phase-legs 106-110. In the non-limiting aspect illustrated in FIG. 1, the modulator 112 is depicted as a part of the power converter 100. In other aspects, the modulator 112 can be disposed remote from the power converter 100. In some aspects, the modulator 112 can include a controller module 126 configured to control operations of the phase-leg 106-110 to facilitate the conversion of the DC power to the AC power by the phase-legs 106-110. The controller module 126 can include hardware elements such as a specially programmed general-purpose computer, an electronic processor such as a microprocessor, a digital signal processor, an FPGA, a microcontroller, or combinations thereof. Further, the controller module 126 can include input/output ports (I/O) and a storage medium, such as an electronic memory. Various examples of the microprocessor include, but are not limited to, a reduced instruction set computing (RISC) architecture type microprocessor or a complex instruction set computing (CISC) architecture type microprocessor. Further, the microprocessor can be a single-core type or multi-core type. Alternatively, the controller module 126 can be implemented using hardware elements such as circuit boards with processors, logic gates, or as software running on a processor such as a personal computer (PC), or a microcontroller.

The controller module 126 can be communicatively coupled to the phase-legs 106-110. More particularly, the controller module 126 can be communicatively coupled to the respective switches 210-220 (see FIG. 2) of the phase-legs 106-110 and configured to selectively control switching of the switches 210-220 to facilitate conversion of the DC power to the AC power. As will be described in more detail herein, the controller module 126 can be configured to operate the phase-legs 106-110 such that the respective switching speed of the switches 210-220 of the phase-legs 106-110 is selectively adjusted based on the output state of a respective phase-leg 106-110 of the power converter 100, consequently resulting in a reduction in the voltage stress on the switches 210-220 of the phase-legs 106-110.

It can be noted that use of the three phase-legs 106-110 in the power converter 100 aids in generating a three-phase output at the output port 104. It will be appreciated that although the power converter 100 of FIG. 1 is shown as having the three phase-legs 106-110, other aspects are not so limited, and use of a power converter having less than three phase-legs or greater than three phase-legs is also contemplated. For example, a power converter with one phase-leg can produce a single-phase output voltage. By way of another non-limiting example, a power converter with two phase-legs can produce a two-phase output voltage.

Figure 2:
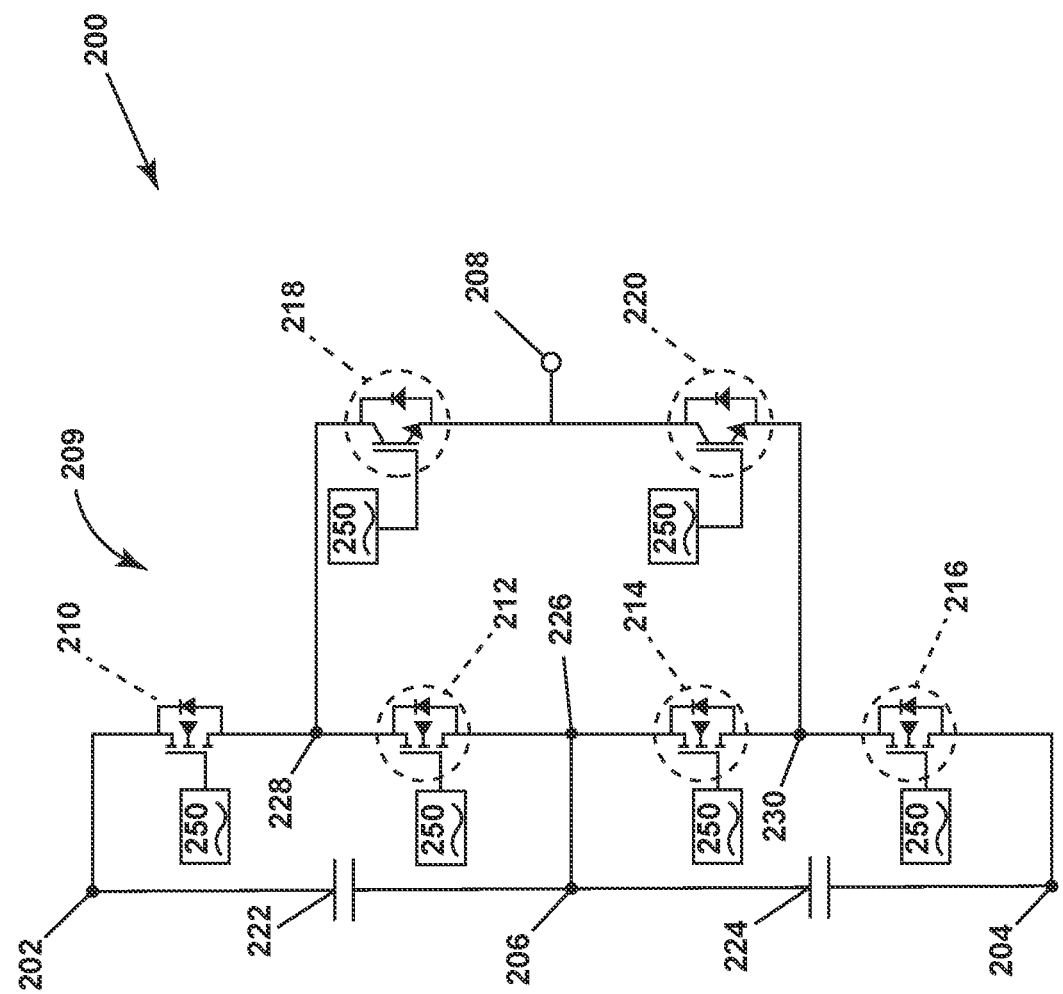
FIG. 2 is a schematic diagram of a phase-leg of the ANPC converter of FIG. 1, in accordance with various aspects described herein.

Referring now to FIG. 2, a schematic diagram of one non-limiting aspect of a phase-leg 200, such as the phase-leg 106 of the power converter 100 of FIG. 1, in accordance with aspects of the present disclosure, is shown. In some aspects, other phase-legs, such as phase-legs 108 and 110 can also have a configuration similar to the configuration of the phase-leg 200 depicted in FIG. 2. Also, FIG. 2 will be described with reference to the components of FIG. 1.

In some aspects, the phase-leg 200 can include a set of input terminals such as a first input terminal 202, a second input terminal 204, and a neutral input terminal 206. The phase-leg 200 can also include a first set of switches 209 and an output terminal 208. The first set of switches 209 can include a first switch 210, a second switch 212, a third switch 214, a fourth switch 216, a fifth switch 218, and a sixth switch 220. The first switch 210, second switch 212, third switch 214, fourth switch 216, fifth switch 218, and sixth switch 220 can hereinafter be referred to as switches 210-220. The first set of switches 209 can also include a set of corresponding gate drive circuits 250. For example, a respective gate drive circuit 250 can be communicatively coupled to each switch 210-220. For example, a respective gate drive circuit 250 can be communicatively coupled to a gate terminal of each respective switch 210-220. The set of gate drive circuits 250 can be communicatively coupled to the controller module 126 of the modulator 112 to receive a command signal (e.g., a PWM voltage signal) therefrom.

Although not depicted in FIG. 2, the first input terminal 202, the second input terminal 204, and the neutral input terminal 206 of the phase-leg 200 can be respectively communicatively coupled to the positive input terminal 114, the negative input terminal 118, the neutral input terminal 116 of the power converter 100 of FIG. 1. Also, the output terminal 208 of the phase-leg 200 can be communicatively coupled to the output terminal 124 of the power converter 100 of FIG. 1. Furthermore, a respective gate terminal of each of the switches 210-220 can be operatively coupled to the modulator 112 of the power converter 100. More particularly, the gate terminal of each of the switches 210-220 can be communicatively coupled to the controller module 126 of the modulator 112.

For ease of description and understanding, FIG. 2 depicts one non-limiting aspect of the phase-leg 200 having six switches 210-220. However, aspects having the phase-leg 200 comprising greater than six or fewer than six switches are also contemplated. Moreover, in the non-limiting aspect of FIG. 2, the switches 210-216 are discussed and described as comprising SiC MOSFETs, and the switches 218-220 are discussed and described as comprising IGBTs, wherein each switch 218-220 can include a semiconductor switch element and an anti-parallel diode. Other aspects are not so limited and the phase-leg 200 having other types of switches is also contemplated. Other non-limiting examples of the switches 210-220 can include transistors, gate commutated thyristors, FETs, MOSFETs, IGBTs, gate turn-off thyristors, static induction transistors, static induction thyristors, or combinations thereof. Furthermore, materials used to form the switches 210-220 can include, but are not limited to, silicon (Si), germanium (Ge), SiC, gallium nitride (GaN), or combinations thereof.

As will be appreciated, a SiC switch module (e.g., a MOSFET) can include more than one switch. Therefore, in some non-limiting aspects, three such SiC modules can be used to form the phase-leg 200 of FIG. 2. By way of example, a first SiC switch module (not shown) can comprise the first and second switches 210 and 212, a second SiC switch module (not shown), can comprise the third and fourth switches 214 and 216, and a third IGBT switch module (not shown) can comprise the fifth and sixth switches 218 and 220. It will be appreciated that other types of switch modules can also be used without limiting the scope of the present disclosure.

As depicted in the non-limiting aspect of FIG. 2, the first switch 210, the second switch 212, the third switch 214, and the fourth switch 216 can be coupled electrically in series. More particularly, the switches 210-216 can be coupled electrically in series such that a source terminal of the first switch 210 is connected to a drain terminal of the second switch 212, a source terminal of the second switch 212 is connected to a drain terminal of the third switch 214, and a source terminal of the third switch 214 is connected to a drain terminal of the fourth switch 216.

Further, the first switch 210 is operatively coupled to the first input terminal 202 and the fourth switch 216 is operatively coupled to the second input terminal 204. More particularly, as depicted in FIG. 2, a drain terminal of the first switch 210 can be connected to the first input terminal 202, while a source terminal of the fourth switch 216 can be connected to the second input terminal 204.

Furthermore, a first node 226 represents an interconnection point of the second switch 212 and the third switch 214. The first node 226 is communicatively coupled to the neutral input terminal 206. Also, reference numeral 228 represents a node or interconnection point of the first switch 210 and the second switch 212. The fifth switch 218 is communicatively coupled between the node 228 and the output terminal 208. More particularly, in the non-limiting example of FIG. 2, a collector terminal of the fifth switch 218 is connected to the node 228 and an emitter terminal of the fifth switch 218 is connected to the output terminal 208. Moreover, reference numeral 230 represents a node or interconnection point of the third switch 214 and the fourth switch 216. The sixth switch 220 is communicatively coupled between the node 230 and the output terminal 208. In particular, an emitter terminal of the sixth switch 220 is connected to the node 230 and a collector terminal of the sixth switch 220 is connected to the output terminal 208.

Moreover, in some aspects, the phase-leg 200 can also include capacitors 222 and 224. The capacitor 222 is connected between the first input terminal 202 and the neutral input terminal 206. Also, the capacitor 224 is connected between the second input terminal 204 and the neutral input terminal 206.

Figure 4:
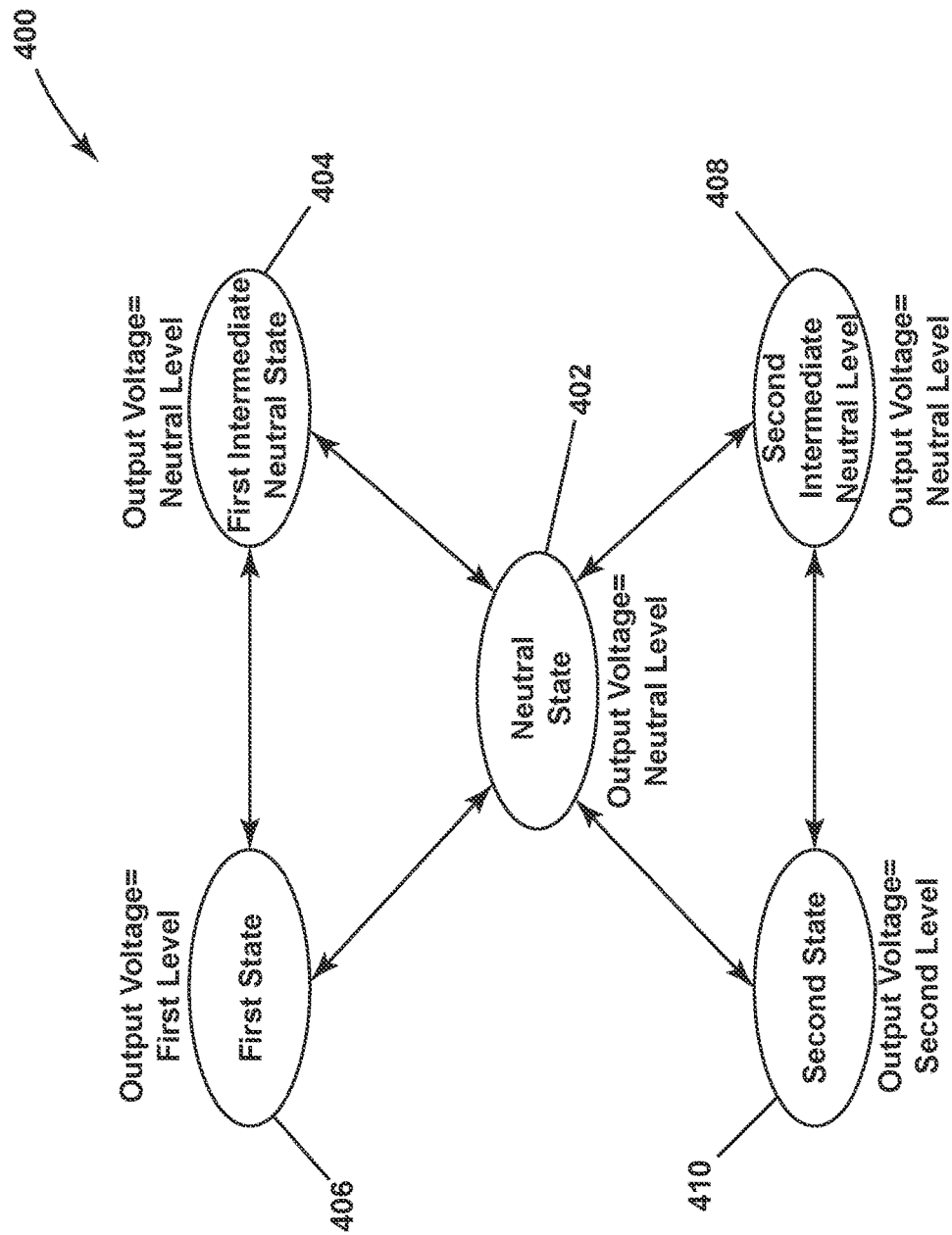
FIG. 4 is a state diagram depicting transitions of an operating state of the phase-leg of FIG. 2 to generate the output voltage of FIG. 3, in accordance with various aspects described herein.

The controller module 126 can be configured to operate the phase-leg 200 in one or more operating states including, but not limited to, a neutral state, a first intermediate neutral state, a first state, a second intermediate neutral state, or a second state (see FIG. 4).

Figure 3:
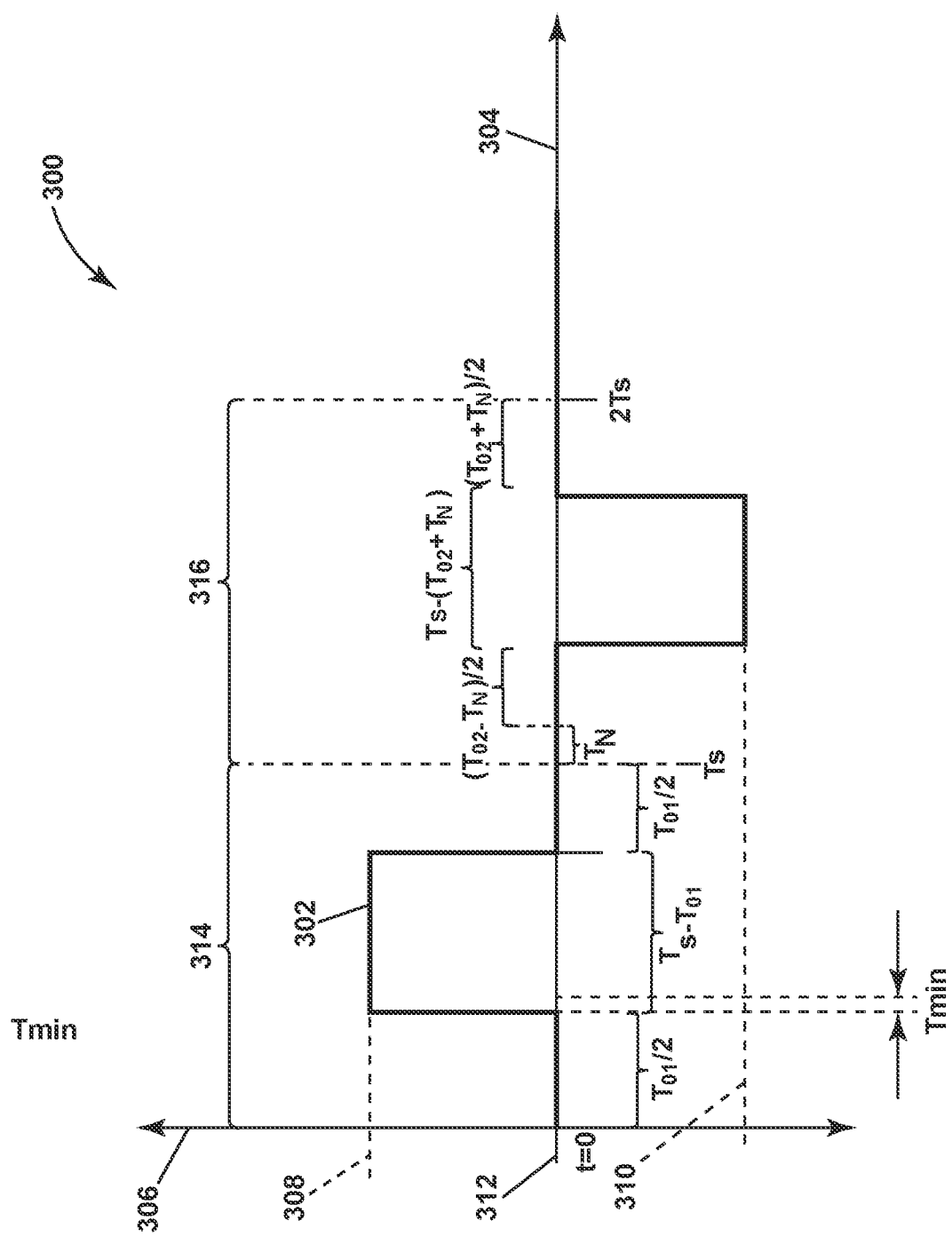
FIG. 3 is a graphical representation of an example signal representing an output voltage of the phase-leg of FIG. 2, in accordance with various aspects described herein.

In some aspects, the phase-leg 200, when operated in any of the neutral state, the first intermediate neutral state, or the second intermediate neutral state, can be configured to generate an output voltage having the neutral level at the output terminal 208. Moreover, the phase-leg 200, when operated in the first state, can be configured to generate the output voltage having the first level at the output terminal 208. In a similar fashion, the phase-leg 200, when operated in the second state, can be configured to generate the output voltage having the second level at the output terminal 208. A signal representative of an example output voltage of the phase-leg 200 is depicted in FIG. 3.

To transition the state of the phase-leg 200 between the neutral state, the first intermediate neutral state, the first state, the second intermediate neutral state, and the second state, the controller module 126 can be configured to selectively operate one or more of the switches 210-220 in a conducting state and operate the remaining switches in a non-conducting state. As will be appreciated, the switches operated in the conducting state allow an electrical current to pass through, while the switches operated in the non-conducting state block a flow of the electrical current therethrough.

The controller module 126 can be configured to operate the switches 210-220 in the conducting state or the non-conducting state by providing a command signal (e.g., a PWM command signal) to the respective gate drive circuit 250 of that switch 210-220.

In the aspect of FIG. 2, the switches 210-216 are depicted as N-channel SiC MOSFETs, and the switches 218-220 are depicted as IGBTs. Accordingly, to operate any of the switches 210-220 in the conducting state, it is desirable to supply a control or drive signal having a higher magnitude (H) to a corresponding gate terminal. It can be noted that the control or drive signal having the higher magnitude is representative of a control or drive signal having a magnitude that is greater than a magnitude of a signal provided to a corresponding source or emitter terminal. Similarly, to operate any of the switches 210-220 in the non-conducting state, it is desirable to supply a control or drive signal having a lower magnitude (L) to the corresponding gate terminal. It can be noted that the control signal having the lower magnitude is representative of a control or drive signal having a magnitude that is lower than a magnitude of a signal provided to a corresponding source or emitter terminal. Moreover, it can be noted that if P-channel SiC MOSFETs are used as the switches 210-220, the levels of the control signals can be interchanged.

Accordingly, to operate any of the switches 210-220 in the conducting state, the controller module 126 can be configured to supply a drive signal via the respective gate drive circuit 250 having the higher magnitude to the gate terminals of the respective switches 210-220. Similarly, to operate any of the switches 210-220 in the non-conducting state, the controller module 126 can be configured to supply a drive signal via the gate drive circuit 250 having the lower magnitude (L) to the gate terminals of the respective switches 210-220.

FIG. 3 is a graphical representation 300 depicting an example signal that represents an output voltage 302 of a phase-leg such as the phase-leg 200, in accordance with aspects of the present disclosure. FIG. 3 is described with reference to the components of FIG. 2.

The output voltage 302 can be obtained at the output terminal 208 of the phase-leg 200. Reference numeral 304 represents an X-axis and the reference numeral 306 represents a Y-axis. The X-axis 304 and the Y-axis 306 respectively represent time and an amplitude of the output voltage 302. Further, reference numerals 308, 310, and 312 represent a first level, a second level, and a neutral level, respectively, of the output voltage 302. Moreover, reference numerals 314 and 316 respectively represent a first cycle and a second cycle of the output voltage 302. For ease of illustration, two cycles (i.e., the first and second cycles 314, 316) of the output voltage 302 are represented in FIG. 3. It will be appreciated that output voltage 302 can include more than two cycles. Further, in the example of FIG. 3, the first cycle 314 is shown as a positive cycle while the second cycle 316 is shown as a negative cycle. Other aspects are not so limited, and in other aspects, the phase-leg 200 can generate the output voltage 302 having any number of first cycles 314, any number of second cycles 316, or any combination or pattern of the first and second cycles 314, 316. Moreover, use of the phase-leg 200 to generate the output voltage 302 having only the first cycles 314 or only the second cycles 316 is also contemplated.

In FIG. 3, $T_{O1}$ represents a total time corresponding to a first intermediate neutral state of the phase-leg 200, T 02 represents a total time corresponding to a second intermediate neutral state of the phase-leg 200, T N represents the total time of the neutral state, Tmin, represents a minimum pulse duration corresponding to any of the first, second, and third levels 308, 310, 312 of the output voltage 302, and Ts represents a time period of a single cycle such as the first cycle 314 or the second cycle 316 of the output voltage 302 of the phase-leg 200.

FIG. 4 is a state diagram 400 depicting transitions of an operating state of the phase-leg 200 of FIG. 2 to generate the output voltage 302 of FIG. 3, in accordance with aspects of the present specification. FIG. 4 is described in conjunction with FIGS. 2 and 3. The output or operating states can comprise the neutral state 402, the first intermediate neutral state 404, the first state 406, the second intermediate neutral state 408, and the second state 410. The arrows are used to generally indicate a non-limiting subsequent operating state corresponding to a given operating state, with a double-headed arrow used to generally indicate a transition from a given operating state to a non-limiting subsequent operating state can occur in either direction.

During operation of the phase-leg 200, at time t=0, if it is assumed that the phase-leg 200 is operating in the neutral state 402 and the output voltage 302 having the first level 308 is desired as depicted in the first cycle 314, the controller module 126 is configured to transition the phase-leg 200 to the first intermediate neutral state 404 and subsequently to the first state 406. Further, the controller module 126 can be configured to maintain the phase-leg 200 in the first state 406 for a first predetermined time duration. The first predetermined time duration can be computed by the controller module 126 based on a desired frequency and duty-cycle of the output voltage 302.

In a non-limiting aspect, subsequent to the lapse of the first predetermined time duration, the controller module 126 can be configured to transition the phase-leg 200 back to the neutral state 402. In other aspects, as depicted in FIG. 4, the controller module 126 can be configured to transition the phase-leg 200 directly to the neutral state 402 from the first state 406. In other aspects, as indicated by the double headed arrows, in FIG. 4, the controller module 126 can be configured to transition the phase-leg 200 to the neutral state 402 from the first state 406 via the first intermediate neutral state 404.

Moreover, to generate the output voltage 302 having the second level 310, the controller module 126 can be configured to transition the phase-leg 200 to second intermediate neutral state 408 and subsequently to the second state 410. Further, the controller module 126 can be configured to maintain the phase-leg 200 in the second state 410 for a second determined time duration. The second determined time duration can be computed by the controller module 126 based on a desired frequency and duty-cycle of the output voltage 302. Subsequent to the lapse of the second determined time duration, the controller module 126 can be configured to transition the phase-leg 200 back to the neutral state 402. In one aspect, as depicted in FIG. 4, the controller module 126 can be configured to transition the phase-leg 200 directly to the neutral state 402 from the second state 410. Alternatively, as indicated by the double headed arrows in FIG. 4, the controller module 126 can be configured to transition the phase-leg 200 to the neutral state 402 from the second state 410 via the second intermediate neutral state 408.

Table 1 illustrates levels of the output voltage 302 corresponding to the operating states 402-410, and the corresponding condition of the switches 210-220 of FIG. 2. As will be understood, the respective state of each switch 210-220 is illustrated in Table 1 by a numeral "1" or "0", wherein the numeral "1" is indicative of a switch 210-220 that is in an "ON" or conducting state, and the numeral "0" is indicative of a switch 210-220 that is in an "OFF" or non-conducting state. depicted as having a state of "1", and a switch 210-220.

TABLE 1

| Operating State of | Switch Condition | | | | | | Converter Output |
|---|---|---|---|---|---|---|---|
| Phase-leg 200 | 210 | 212 | 214 | 216 | 218 | 220 | Voltage State |
| Off | 0 | 0 | 0 | 0 | 0 | 0 | Off |
| First Int. Neutral 404 | 0 | 1 | 0 | 0 | 1 | 0 | Neutral level 312 |
| First state 406 | 1 | 0 | 1 | 0 | 1 | 0 | First level 308 |
| Second Int. Neutral 408 | 0 | 0 | 1 | 0 | 0 | 1 | Neutral level 312 |
| 2nd state 410 | 0 | 1 | 0 | 1 | 0 | 1 | Second level 310 |
| Neutral 402 | 0 | 1 | 1 | 0 | 1 | 1 | Neutral level 312 |

Some ANPC converters can employ a hybrid switching arrangement, for example having a set of IGBTs as the switching devices at the AC output side of the converter. For example, employing a respective IGBT in lieu of a MOSFET for the fifth switch 218 and sixth switch 220. In such cases, when the output voltage of the converter changes polarity, (e.g., after turn-off of an IGBT), minority carriers can remain or be stored in an N-drift region of the IGBT device. When a voltage is subsequently applied across the IGBT device before a charge recombination is complete (e.g., at a fast switching speed), the remaining or stored minority carriers flow out, causing a "current bump" in the device. The "current bump" flowing in the IGBT device and a large commutation loop can cause a high voltage stress across the IGBT device. Similarly, the reverse recovery of the silicon diode can cause high voltage stress across the IGBT device after a polarity change of the output voltage.

To reduce such high voltage stresses across the fifth switch 218 and sixth switch 220, the gate resistance of the other switches (e.g., switches 210-216) can be increased. However, the increased gate resistance value would be higher than necessary during periods when there is no polarity change of the PWM voltage signal command. Thus, simply increasing the gate resistance of the switches 210-220 of the first set of switches 209 to reduce voltage overshoot across the fifth switch 218 and sixth switch 220 would result in increased switching loss of the remaining switches 210-216, and reduce the converter 200 operating efficiency.

Figure 5:
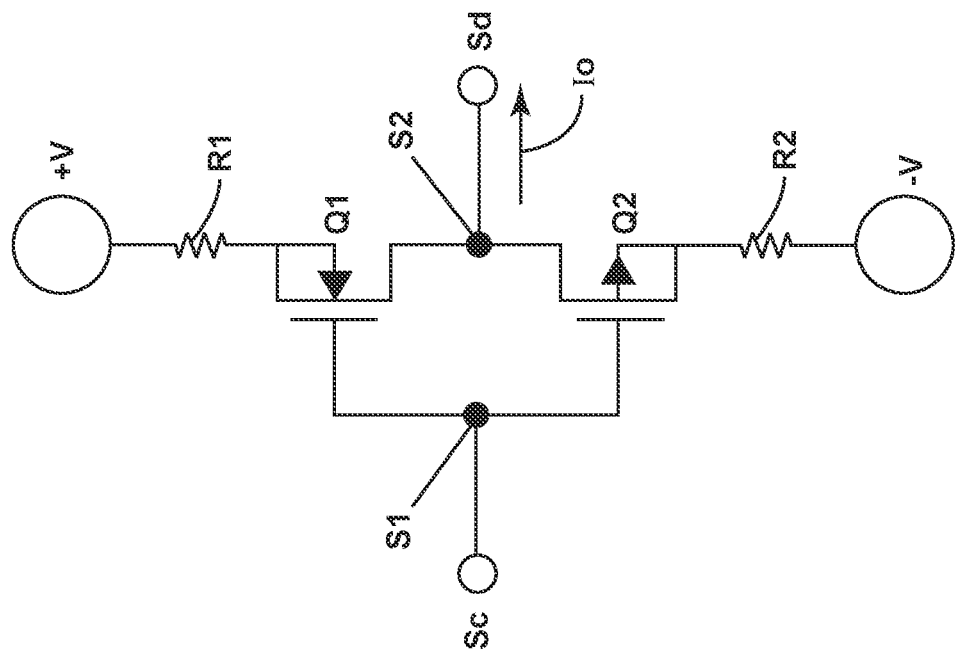
FIG. 5 depicts a conventional gate drive circuit.

For example, FIG. 5, depicts a schematic diagram of a conventional gate drive circuit. Typically, the gate drive circuit includes complimentary first and second switches Q1, Q2, for example embodied in a N-channel MOSFET and a P-channel MOSFET, respectively, with coupled gate terminals. A command signal Sc (e.g., a PWM signal) is provided to the junction "S1" coupling the gate terminals of the first and second Switches Q1, Q2, of the gate drive circuit. A drive signal Sd is provided to the junction "S2" coupling the drain terminals of the first and second Switches Q1, Q2. In a typical power converter, the first switch Q1, and second switch Q2 can be connected between power terminals to define a positive actuation potential (designated "+V"), and a negative actuation potential (designated "−V"). The positive and negative actuation potentials +V, −V are respective actuation potentials referenced to the electrical potential on the junction S1. The switches Q1, Q2 can be MOSFETS, and can be respectively selectively actuated in response to the input signal Spwm. When the upper switch Q1 is in an "ON" condition (i.e., conducting) and the lower switch Q2 is in an "OFF" condition (i.e., non-conducting), the drive signal Sd is at the positive actuation potential V, and a gate charging current flows in the direction illustrated by arrow "Io". When the lower switch Q2 is in an ON condition, and the upper switch Q1 is in an OFF condition, the drive signal output Sd is at the negative actuation potential −V or zero, and a discharge current flows in the opposite direction to the one illustrated by arrow "To". The value of the charge and discharge current Io will be dependent on the value of the resistors R1 and R2 respectively, sometimes called a "turn-on resistor" R1 and a "turn-off resistor" R2.

During switching operations, the switching behavior (e.g., a switching speed) of each switch Q1, Q2 can typically be defined at least in part by the respective resistance value of the turn-on resistor R1, or turn-off resistor R2, respectively. The turn-on resistor R1 or turn-off resistor R2 are typically embodied in resistors having a predetermined fixed resistance value, and are coupled to the drain or source terminal of each switch Q1, Q2, respectively. Conventional turn-on and turn-off resistors R1, R2 can have resistance values selected based on a desired switching speed or dive signal output Sd. The turn-on and turn-off resistors R1, R2 can also limit the magnitude of the output current Io and protect the corresponding switch Q1, Q2 from voltage transients that can damage the switch Q1, Q2 (e.g., an avalanche breakdown). For example, using a relatively large resistance value for the turn-on resistor R1 and turn-off resistor R2 can provide an increased degree (relative to lower resistance values) of voltage transient protection, but will slow the rate of charge or discharge of the respective input capacitance of each switch Q1, Q2, and thereby result in a slower switching speed of each switch Q1, Q2. Conversely, using a relatively small resistance value for the turn-on resistor R1 and turn-off resistor R2 can provide a relatively lower degree (relative to higher resistance values) of voltage transient protection, but will speed the rate of charge or discharge of the respective input capacitance of the semiconductor switch being driven by the gate drive circuit, and thereby result in a relatively faster switching speed than when arranged with relatively higher resistance values for turn-on resistor R1 and turn-off resistor R2. The value of each turn-on resistor R1 and turn-off resistor R2 is typically selected or predetermined based on a calculated worst-case condition and is not optimized for switching speed in all output states or operating conditions of the converter. Thus, conventional gate drive circuits have a relatively large resistance value of the turn-on resistor R1 and turn-off resistor R2 value in all operating states of the converter, which can result in less than optimal switching speeds and switching losses.

Figure 6:
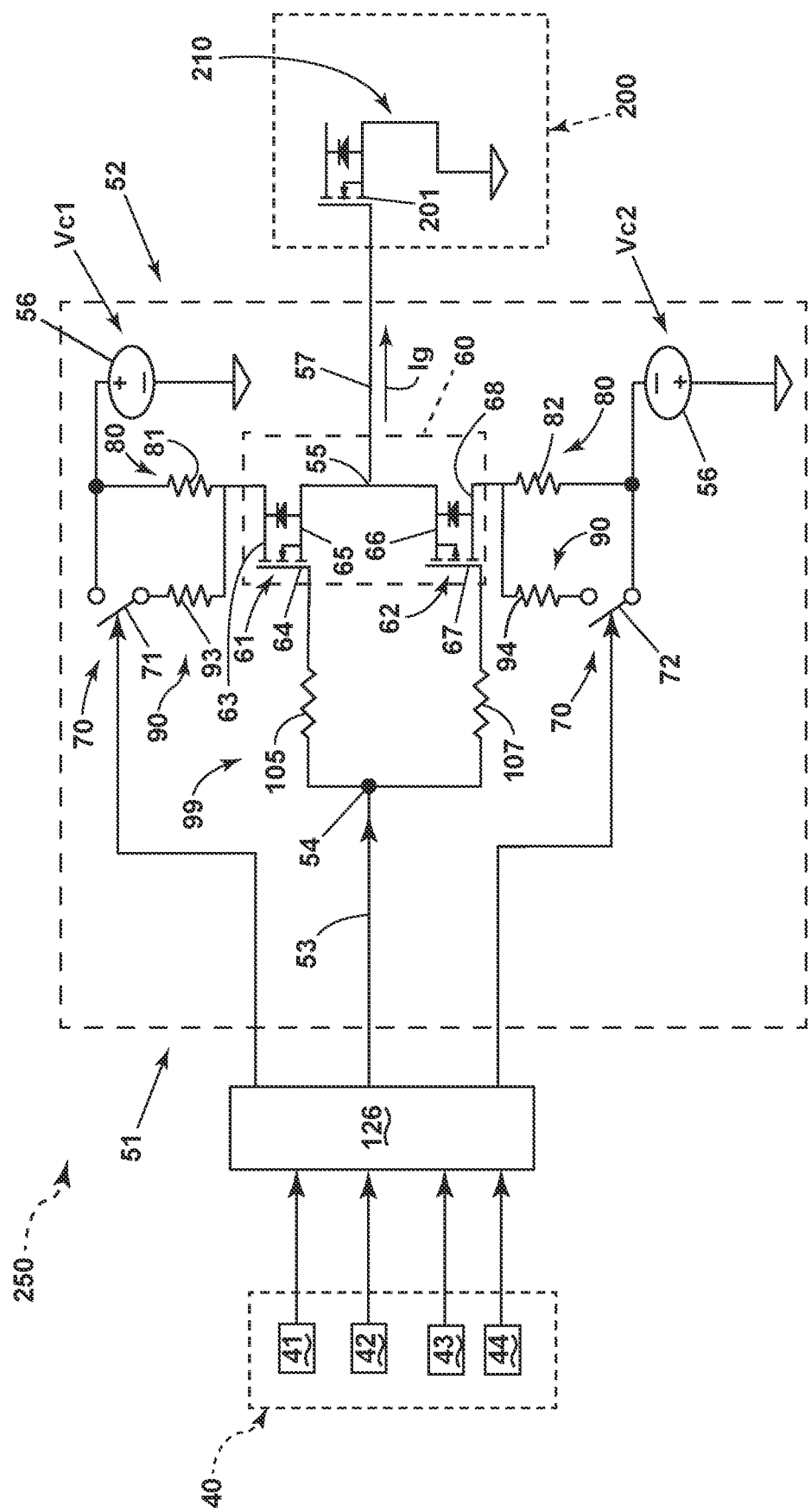
FIG. 6 is a schematic diagram of a gate drive circuit in accordance with various aspects described herein.

FIG. 6 illustrates a non-limiting example of a gate drive circuit 250 in accordance with an aspect. For example, the gate drive circuit 250 can correspond to a switch 210-220 of a respective phase-leg 200 of the power converter 100. In such aspects, responsive to a respective command signal 53 from the controller module 126, each gate drive circuit can be configured to selectively operate the corresponding switch 210-220. For ease of description an understanding, FIG. 6 is depicted showing only on switch 210, with the other switches 212-220 omitted for clarity. It will be appreciated that references to switch 210 operation can be respectively applied to switches 212-220. As will be described in more detail herein, the gate drive circuit 250 can be configured to selectively adjust or modify one of a resistance (e.g., a gate resistance 80, 90) and a current (e.g., a gate current Ig) to the corresponding switch 210 based on an output state 402, 404, 406, 408, 410 of the respective phase-leg 200. The controller module 126 can be communicatively coupled with a set of sensors 40 or other source of data associated with the operation of the power converter 100. For example, the set of sensors 40 can include a temperature sensor 41 configured to provide information indicative of an operation temperature associated with the operation of the power converter 100, a current sensor 42 configured to provide information indicative of an electrical current associated with the operation of the power converter 100, or a voltage sensor 43 configured to provide information indicative of an voltage associated with the operation of the power converter 100, or a combination thereof. The set of sensors 40 can include a switch sensor 44 configured to provide information indicative of an status of a corresponding switch 210-220 of the phase-leg 200, Accordingly, the gate drive circuit 250 can be configured to selectively adjust or modify one of a gate resistance 80, 90 and a gate current Ig to the corresponding switch 210 based on a output state of the respective phase-leg 200, at least one of temperature data, current data, voltage data, or a switch 210 status, or a combination thereof, provided to the controller module 126. For ease of description, the gate drive circuit 250 of FIG. 6 is depicted as communicatively coupled to the first switch 210, it will be appreciated that in other aspects, a respective gate drive circuit 250 can likewise be communicatively coupled to the remaining switches 210-220 of a phase-leg 200. For example, non-limiting aspects of a phase-leg 200 can include a set of switching elements 209 communicatively coupled with a set of gate drive circuits 250. Each gate drive circuit 250 can be configured to provide a respective gate drive signal to a corresponding switch 210-220, each switch 210-220 being switchably responsive to the respective drive signal. Such power converters 100 can include a controller module 126 configured to control an output state 402, 404, 406, 408, 410 of the power phase-leg 200, and selectively change one of a respective resistance 80, 90 and a gate current Ig of a corresponding subset of the gate drive circuits 250 based on the output state 402, 404, 406, 408, 410 of the phase-leg 200.

The gate drive circuit 250 can include a gate drive circuit input side 51 and a gate drive circuit output side 52. The gate drive circuit 250 can further include a second set of gate control switches 60, including a first gate control switch 61, and a second gate control switch 62, and a third set of gate control switches 70 including a first speed control switch 71 and a second speed control switch 72. The gate drive circuit 250 can further include a first set of resistors 80, a second set of resistors 90, and a third set of resistors 99. The first set of resistors 80 can include a first resistor 81 and a second resistor 82. The second set of resistors 90 can include a third resistor 93 and a fourth resistor 94 arranged electrically in parallel with the first resistor 81 and second resistor 82, respectively. The third set of resistors 99 can include a fifth gate resistor 105 and a sixth gate resistor 107. A voltage source 56 can be coupled to the gate drive circuit 250 to provide a control voltage such as a first control voltage Vc1 and a second control voltage Vc2, to the second set of gate control switches 60 via the first set of resistors 80. The third set of gate control switches 70 can further selectively additionally provide the first control voltage Vc1 and second control voltage Vc2 via the second set of resistors 90. The gate drive circuit input side 51 can be communicatively coupled via an input node 54 to the controller module 126. In non-limiting aspects, the first gate terminal 64 can be communicatively coupled to the input node 54 via the fifth gate resistor 105, and the second gate terminal 67 can be communicatively coupled to the input node 54 via the sixth gate resistor 107. The controller module 126 can be configured to provide a command signal 53, such as a PWM signal to the input node 54. The first gate control switch 61, and the second gate control switch 62 can be respectively selectively actuated in response to the command signal 53. The gate drive circuit output side 52 can be communicatively coupled, via a gate drive circuit output node 55, to a signal input terminal 201 (e.g., a gate terminal) of the corresponding switch 210 to provide a gate drive signal 57 thereto to thereby operate or drive the corresponding switch 210.

In non-limiting aspects, the first gate control switch 61 can comprise a MOSFET-type switch, having a first source terminal 65, a first gate terminal 64, and a first drain terminal 63. In non-limiting aspects the second gate control switch 62 can comprise a MOSFET-type switch, having a second source terminal 66, a second gate terminal 67, and a second drain terminal 68. The first gate control switch 61 and second gate control switch 62 can be coupled at the gate drive circuit output node 55. For example, as depicted, the first source terminal 65 and second source terminal 66 can be communicatively coupled to the gate drive circuit output node 55. In non-limiting aspects, the first gate terminal 64 and second gate terminal 67 can be communicatively coupled to the input node 54 via the fifth gate resistor 105 and sixth gate resistor 107, respectively.

In the example illustrated, when the first gate control switch 61 is in an "ON" condition (e.g., conducting) and the second gate control switch 62 is in an "OFF" condition (e.g., non-conducting), the command signal 53 is at the positive actuation potential Vc1, and a charging or gate current Ig flows in the direction illustrated by the arrow "Ig". Conversely, when the second gate control switch 62 is in an ON condition, and the first gate control switch 61 is in an OFF condition, the gate current Ig is at the negative actuation potential Vc2, and a discharge current flows in the opposite direction to the one indicated by the arrow "Ig".

As will be described in more detail herein, depending on the state of the first speed control switch 71 and second speed control switch 72, the value of the gate current Ig (e.g., a charging or discharging current) can be dependent on the value of the first resistor 81 and third resistor 93, (i.e., a turn-on resistance) and the value of the second resistor 82 and fourth resistor 94, (i.e., a turn-on resistance).

The positive and negative actuation potentials Vc1, Vc2 are respective actuation potentials referenced to the electrical potential on the input node 54. The first gate control switch 61 can be communicatively coupled to the voltage source 56 receive the first control voltage Vc1 via the first resistor 81. In non-limiting aspects, the first control voltage Vc1 can be a positive DC voltage. The second gate control switch 62 can be communicatively coupled to the voltage source 56 to receive the second control voltage Vc2 via the second resistor 82. In non-limiting aspects, the second control voltage Vc2 can be a negative DC voltage. In aspects, the first gate control switch 61 can be configured to selectively switch or toggle to an ON or conductive state when the command signal 53 (e.g. a PWM signal) is a positive voltage. The first gate control switch 61 can additionally be configured to selectively switch or toggle to an OFF or non-conductive state when the command signal 53 is a negative voltage. Conversely, the second gate control switch 62 can be configured to selectively switch or toggle to an ON or conductive state when the command signal 53 is a negative voltage. The second gate control switch 62 can additionally be configured to selectively switch or toggle to an OFF state when the command signal 53 is a positive voltage.

For ease of description and understanding, the switches of the second set of gate control switches 60 and third set of gate control switches 70 are generally described as comprising MOSFET type switches. However, other aspects are not so limited, and the switches of the second set of gate control switches 60 and third set of gate control switches 70 can comprise any desired type of switching device. In non-limiting aspects, the switches the second set of gate control switches 60 and third set of gate control switches 70 can comprise any desired switching device that can switch a state between a low resistance or ON state (conducting) and a high resistance or OFF state (non-conducting) in response to an electrical signal. For example, the switches of the second set of gate control switches 60 and third set of gate control switches 70 in various aspects can comprise, without limitation, any desired type of switching element such as, MOSFETs, JFETs, IGBTs, gate commutated thyristors, field effect transistors (FETs), IGBTs, MOSFETs, gate turn-off thyristors, static induction transistors, static induction thyristors, or combinations thereof without departing from the scope of the disclosure.

In non-limiting aspects, the first resistor 81 can be coupled in series with the first drain terminal 63 of the first gate control switch 61, and the second resistor 82 can be coupled in series with the second drain terminal 68 of the second gate control switch 62. The respective resistance value (e.g., in ohms) of the first resistor 81 and the second resistor 82 can be predetermined resistance values to provide an optimized switching speed of the switch 210, when the output state 402, 404, 406, 408, 410 of the corresponding phase-leg 200 comprises either a first state having a first output voltage, or a second state having a second output voltage.

As discussed hereinabove, the controller module 126 can be configured to operate the phase-leg 200 in one or more operating states including, but not limited to, a neutral state, a first intermediate neutral state, a first state, a second intermediate neutral state, or a second state (see FIG. 4). Accordingly, the controller module 126 can be further configured to selectively actuate, toggle, or otherwise operate the third set of gate control switches 70 based on the operating state of the phase-leg 200.

For example, when the operating condition of the phase-leg 200 is such that phase-leg state transitions are between the first state and the first intermediate neutral state (e.g., a positive output voltage), or phase-leg state transitions are between the second state and the second intermediate neutral state (e.g., a negative output voltage), the controller module 126 can be configured to close, or maintained in a closed condition (i.e., in an "ON", or conducting state) the switches of the third set of gate control switches 70. In this arrangement, the third resistor 93 and fourth resistor 94 are operatively coupled to the circuit, in parallel with the first resistor 81 and second resistor 82, respectively. Accordingly, the charge and discharge currents for the switch 210 are thereby increased based at least on the reduced turn-on resistance of the parallel combination of the first resistor 81 and third resistor 93, and the reduced turn-off resistance of the parallel combination of the second resistor 82 and fourth resistor 94, respectively.

In another non-limiting example, when the controller module 126 is operating the phase-leg 200 to change the phase-leg output voltage polarity, the controller module 126 can be further configured to selectively actuate, toggle, or otherwise operate the third set of gate control switches 70 based on the operating state of the phase-leg 200. For example, when the phase-leg 200 output voltage is transitioning from a second level (e.g., a negative voltage) via a neutral level to a first level (e.g., a positive voltage), the controller module 126 can be configured to open, toggle, or otherwise maintain the first speed control switch 71 to an "OFF" or non-conducting state. In this arrangement, the third resistor 93 and fourth resistor 94 are not operatively in the circuit 250. Accordingly, the charge and discharge current for the switch 210 are thereby reduced based at least on the increased turn-on resistance of the first resistor 81 and the increased turn-off resistance of the second resistor 82 with the parallel circuit contribution of the third resistor 93 and fourth resistor 94, respectively, removed.

With this arrangement, a relatively large resistance value for the turn-on resistance and turn-off resistance can be selectively provided, based on the state of the phase-leg 200, to provide an increased degree of voltage transient protection, but will only result in a relatively slower switching speed of the driven switch 210-220 for brief predetermined or selective time periods. Conversely, with this arrangement, a relatively small resistance value for the turn-on resistance and turn-off resistance can be selectively provided, based on the state of the phase-leg 200, to provide a relatively faster switching speed for relatively longer predetermined or selective time periods. In this way, the value of each turn-on resistance and turn-off resistance can be selected or predetermined based on a desired optimized operation for switching speed in all output states 402, 404, 406, 408, 410 or operating conditions of the phase-leg 200.

While various non-limiting aspects have been described for ease of understanding, with reference to FIG. 6, with the first set of speed control switches 70 comprising the first speed control switch 71, and the second speed control switch 72, and the second set of resistors 90 comprising the third resistor 93 and the fourth resistor 94 arranged electrically in parallel with the first resistor 81 and second resistor 82, respectively, other aspects are not so limited. In other non-limiting aspects any number of switching arrangements, and any desired number of resistors, having any desired respective resistance value can be employed without departing from the scope of the disclosure herein. For example, it is contemplated that other non-limiting aspects the first set of speed control switches 70 can comprise a plurality of first speed control switches 71, and the second set of resistors 90 can comprise a plurality of third resistors 93 respectively arranged in series with each other, and in parallel with the first resistor 81. Likewise, it is contemplated that other non-limiting aspects, the first set of speed control switches 70 can comprise a plurality second speed control switches 72, and the second set of resistors 90 can comprise a plurality of fourth resistors 94 respectively arranged in series with each other, and in parallel with the second resistor 82.

In such aspects, each of the plurality of third resistors 93 and plurality of fourth resistors 94 can have a predetermined resistance value. The predetermined resistance value of each third resistor 93 and fourth resistor 94 can be the same value as the other resistors in the plurality of second resistors 93, and the plurality of fourth resistors 94, respectively. In other aspects, the predetermined resistance value of each third resistor 93, and fourth resistor 94 can be a different resistance value from the other resistors in the plurality of second resistors 93, and the plurality of fourth resistors 94, respectively. It is further contemplated that in various aspects, depending on the state of the phase-leg 200, one or more speed control switches 71 of the plurality of first speed control switches 71, or one or more speed control switches 72 of the plurality of second speed control switches 72 can be selectively operated to provide a predetermined turn-on resistance or turn-off resistance. That is, with such arrangements, a predetermined relatively large resistance value for the turn-on resistance and turn-off resistance can be selectively provided using one or more resistors, based on at least the state of the phase-leg 200, to provide an increased degree of voltage transient protection. Conversely, with this arrangement, a relatively small resistance value for the turn-on resistance and turn-off resistance can be selectively provided using one or more resistors, based on at least the state of the phase-leg 200, to provide a relatively faster switching speed for relatively longer predetermined or selective time periods. In this way, the value of each turn-on resistance and turn-off resistance can be selected from a plurality of selectable resistance values, based on a desired optimized operation for switching speed in all output states 402, 404, 406, 408, 410 or operating conditions of the phase leg 200.

In other non-limiting aspects, the output state 402, 404, 406, 408, 410 of the phase-leg 200 need not be limited to being based solely on an output state 402, 404, 406, 408, 410 with respect to a voltage. For example, in non-limiting aspects, the output state 402, 404, 406, 408, 410 of the phase-leg 200 can be based on a combination of an electrical output state 402, 404, 406, 408, 410 and a temperature state of the phase-leg 200. In other non-limiting aspects, the output state of the phase-leg 200 can be based on a combination of a voltage output state 402, 404, 406, 408, 410 and a current state of the phase-leg 200. In still other non-limiting aspects, the output state 402, 404, 406, 408, 410 of the phase-leg 200 can be based on a combination of the voltage output state 402, 404, 406, 408, 410 and a voltage state of a switch 210-220. In still other aspects, the output state 402, 404, 406, 408, 410 of the phase-leg 200 can be determined based on a combination of current, voltage and temperature to determine the switching speed of one or more switching devices in the power converter 100.

Figure 7:
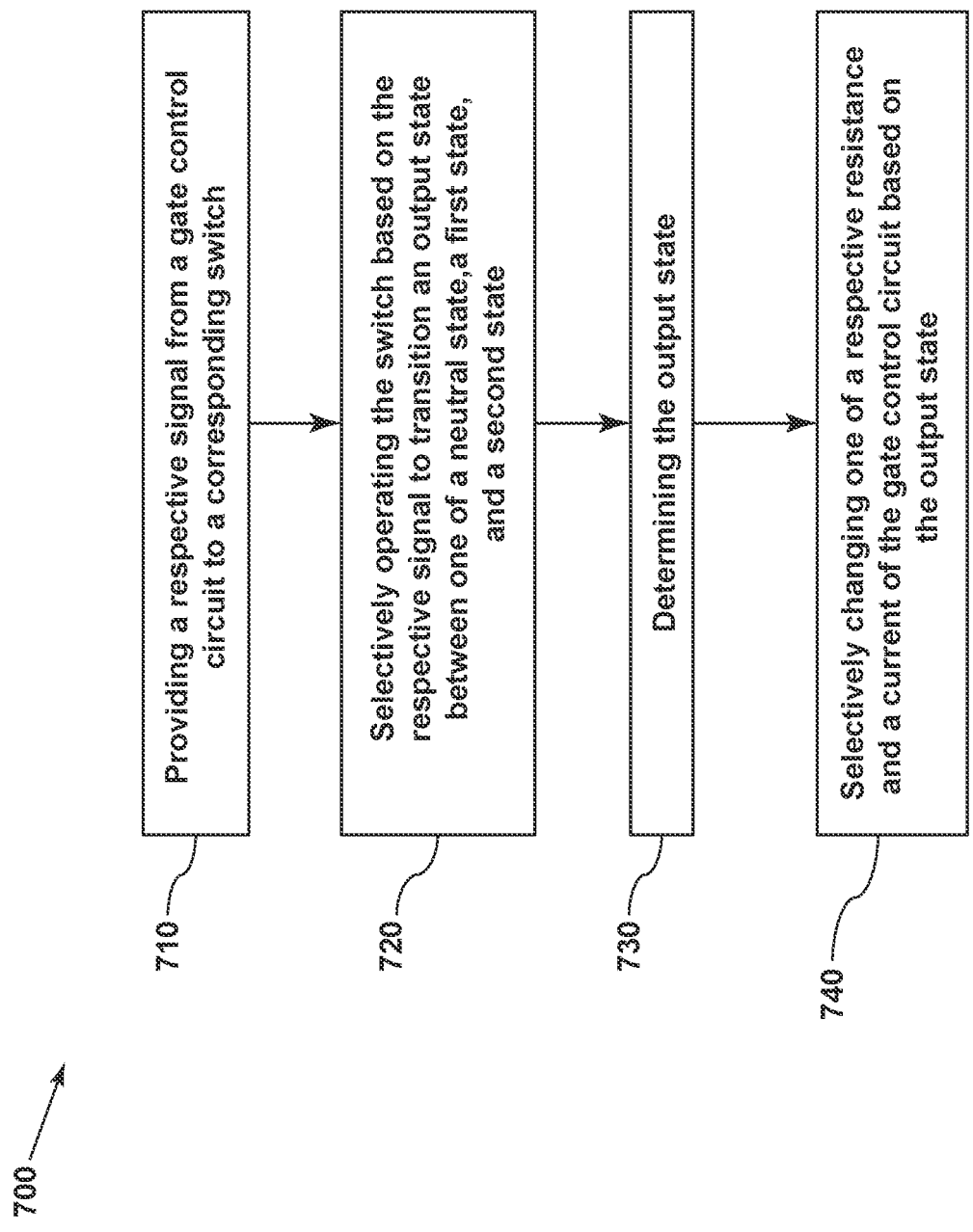
FIG. 7 is a flow diagram of a method of operating a phase-leg of a power converter in accordance with various aspects described herein.

FIG. 7 depicts a method 700 of operating a phase-leg 200 of a power converter 100, the phase-leg 200 comprising set of switches 210-220 communicatively coupled to a respective gate drive circuit 250 and switchably responsive to a respective gate drive signal 57 from the respective gate drive circuit 250. The method 700 begins at 710 by providing the respective gate drive signal 57 from each respective gate drive circuit 250 to a corresponding switch 210-220 of the set of switches, and at 720 switchably transitioning an output state 402, 406, 408, 410 of the phase-leg between one of a neutral state 402 having a neutral output voltage, a first state 406 having a first output voltage, and a second state 410 having a second output voltage, by selectively operating the set of switches 210-220 based on the respective gate drive signal 57. The method 700 can include determining the output state 402, 404, 406, 408, 410 of the phase-leg 200 at 730. The method can also include, at 740 selectively changing at least one of a respective resistance and a current of a subset of the gate drive circuit 250 based on the output state 402, 406, 408, 410 of the phase-leg 200.

The sequence depicted is for illustrative purposes only and is not meant to limit the method 700 in any way as it is understood that the portions of the method can proceed in a different logical order, additional or intervening portions can be included, or described portions of the method can be divided into multiple portions, or described portions of the method can be omitted without detracting from the described method.

Moreover, systems and methods as described herein can be applied during a shutdown operation (e.g., a in response to a fault or trip condition). For example, all of the semiconductor devices can be configured to turn-off or trip immediately with a slower turn-off speed, thereby avoiding additional delay in at least some of the devices.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

Further aspects are provided by the subject matter of the following clauses:

A power converter comprising: a set of switching elements communicatively coupled with a set of gate drive circuits, each gate drive circuit configured to provide a respective signal to a corresponding switching element, the switching element being switchably responsive to the respective signal; and a controller module configured to: control an output state of the power converter, and selectively change one of a respective resistance and a respective gate current of the gate drive circuits based on the output state of the power converter.

The power converter of any preceding clause, wherein the selectively changing one of a respective resistance and a respective gate current of the gate drive circuits results in a change to a switching speed of the corresponding switching elements.

The power converter of any preceding clause, wherein the selectively changing a respective resistance of the gate drive circuits comprises selectively operating a respective speed control switch in each respective gate drive circuit.

The power converter of any preceding clause, wherein the output state of the power converter is one of a positive voltage, a negative voltage, and a neutral voltage.

The power converter of any preceding clause, wherein the neutral voltage output state of the power converter is based on a zero-crossing of an output voltage of the power converter.

The power converter of any preceding clause, wherein when the output state of the power converter is determined to be a neutral voltage, the controller module is configured to selectively actuate a respective speed control switch in each respective gate drive circuit to increase a resistance of the respective gate drive circuit.

The power converter of any preceding clause, wherein when the output state of the power converter is one of a positive voltage and a negative voltage, the controller module is configured to selectively actuate a respective speed control switch in each gate drive circuit of the subset of gate drive circuits to decrease the resistance of the respective gate drive circuit.

The power converter of any preceding clause, wherein the respective resistance of the respective gate drive circuit is changeable in response to an operation of a respective speed control switch the respective gate drive circuit.

The power converter of any preceding clause, wherein the controller module is further configured to determine at least one of a temperature, a voltage, a current, and a switching state, of at least a subset of the switching elements, and to selectively change a respective resistance of a corresponding subset of the gate drive circuits based on the output state of the power converter and on the determined at least one of temperature, voltage, current, and switching state, of the at least a subset of the switching elements.

The power converter of any preceding clause, wherein the respective signal provided by each gate drive circuit is a DC voltage signal.

A method for operating a phase-leg of a power converter, the phase-leg comprising an output terminal, a set of input terminals, and a first set of switches disposed between the set of input terminals and the output terminal, communicatively coupled to a respective gate control circuit of a set of gate control circuits, and switchably responsive to a respective drive signal from the respective gate control circuit, the method comprising: providing a respective drive signal from each gate control circuit to a corresponding switch of the first set of switches; switchably transitioning an output state of the phase-leg between one of a neutral state having a neutral output voltage, a first state having a first output voltage, and a second state having a second output voltage, by selectively operating the first set of switches based on the respective signal; and selectively changing one of a respective resistance and a respective current of a subset of the gate drive circuits based on the output state of the phase-leg.

The method of any preceding clause, wherein the selectively changing one of a respective resistance and a respective current of the subset of the gate drive circuits results in a change to a switching speed of a corresponding subset of switching elements.

The method of any preceding clause, wherein the selectively changing a respective resistance of the subset of the gate drive circuits comprises selectively operating a respective speed control switch in a respective gate driver circuit of the subset of the gate drive circuits to one of increase and decrease the resistance of the respective gate driver circuit.

The method of any preceding clause, wherein the output state of the power converter is one of a positive voltage, a negative voltage, and a neutral voltage.

The method of any preceding clause, wherein the neutral output state of the power converter is based on a zero-crossing of an output voltage of the power converter.

The method of any preceding clause, wherein when the output state of the power converter is determined to be a neutral voltage, further comprising selectively actuating a respective speed control switch in each gate drive circuit of the subset of gate drive circuits to increase a resistance of the respective gate drive circuit.

The method of any preceding clause, wherein when the output state of the power converter is one of a positive voltage and a negative voltage, further comprising selectively actuating a respective speed control switch in each gate drive circuit of the subset of gate drive circuits to decrease a resistance of the respective gate drive circuit.

The method of any preceding clause, wherein the selectively changing one of a respective resistance and a respective current of a subset of the gate drive circuit includes operating a respective speed control switch in each gate drive circuit of the subset of gate drive circuits.

The method of any preceding clause, further comprising determining at least one of a temperature, a voltage, a current, and a switching state, of at least a subset of the first set of switches; and selectively changing a respective resistance of a corresponding subset of the gate drive circuits based on the output state of the phase-leg and the determined at least one of temperature, voltage, current, and switching state, of at least a subset of the first set of switches.

The method of any preceding clause, wherein the respective signal provided by each gate drive circuit is a DC voltage signal.

What is claimed is:

1. A power converter comprising:
    a set of switching elements communicatively coupled with a set of gate drive circuits, each gate drive circuit configured to provide a respective signal to a corresponding switching element, the corresponding switching element being switchably responsive to the respective signal; and
    a controller module configured to:
        control an output state of the power converter, and
        selectively change one of a respective resistance and a respective gate current of the gate drive circuits based on the output state of the power converter;
    wherein the output state of the power converter is one of a first voltage output state, a second voltage output state, and a neutral voltage output state.

2. The power converter of claim 1, wherein the selectively changing one of a respective resistance and a respective gate current of the gate drive circuits results in a change to a switching speed of the corresponding switching elements.

3. The power converter of claim 1, wherein the selectively changing a respective resistance of the gate drive circuits comprises selectively operating a respective speed control switch in each respective gate drive circuit.

4. The power converter of claim 1, wherein the neutral voltage output state further includes at least one of a first intermediate neutral state and a second intermediate neutral state.

5. The power converter of claim 4, wherein, in response to a desired first voltage output state of the power converter, the controller module is further configured to selectively change one of a respective resistance and a respective gate current of the gate drive circuits based on the output state of the power converter to operably transition the output state of the power converter from the neutral voltage output state to the first intermediate neutral state.

6. The power converter of claim 5, wherein the controller module is further configured to selectively change one of a respective resistance and a respective gate current of the gate drive circuits based on the output state of the power converter to operably transition the output state of the power converter from the first intermediate neutral state to the first voltage output state.

7. The power converter of claim 6, wherein operably transitioning from the neutral voltage output state to the first intermediate neutral state, and further to the first voltage output state, operably reduces voltage stress across a power converter output switch.

8. The power converter of claim 4, wherein, in response to a desired second voltage output state of the power converter, the controller module is further configured to selectively change one of a respective resistance and a respective gate current of the gate drive circuits based on the output state of the power converter to operably transition the output state of the power converter from the neutral voltage output state to the second intermediate neutral state.

9. The power converter of claim 8, wherein the controller module is further configured to selectively change one of a respective resistance and a respective gate current of the gate drive circuits based on the output state of the power converter to operably transition the output state of the power converter from the second intermediate neutral state to the second voltage output state.

10. The power converter of claim 9, wherein operably transitioning from the neutral state to the second intermediate neutral state, and further to the second voltage output state, operably reduces voltage stress across a power converter output switch.

11. The power converter of claim 4, wherein selectively changing one of a respective resistance and a respective gate current of the gate drive circuits based on the output state of the power converter, wherein the output state is at least one of a first intermediate neutral state and a second intermediate neutral state enables at least one of charging or discharging a current at a power converter output switch.

12. The power converter of claim 1, further comprising a modulator communicatively coupled with a set of phase legs of the power converter.

13. The power converter of claim 12, wherein the controller module is included with the modulator.

14. The power converter of claim 1, wherein the controller module is further configured to determine at least one of a temperature, a voltage, a current, and a switching state of at least a subset of the switching elements, and to selectively change a respective resistance of a corresponding subset of the gate drive circuits based on the output state of the power converter and on the determined at least one of temperature, voltage, current, and switching state of the at least a subset of the switching elements.

15. A method for operating a phase-leg of a power converter, the phase-leg comprising an output terminal, a set of input terminals, and a set of switches disposed between the set of input terminals and the output terminal, communicatively coupled to a respective gate control circuit of a set of gate control circuits, and switchably responsive to a respective drive signal from the respective gate control circuit, the method comprising:
    providing the respective drive signal from each gate control circuit to a corresponding switch of the set of switches;
    switchably transitioning an output state of the phase-leg between one of a neutral state having a neutral output voltage, a positive state having a positive output voltage, and a negative state having a negative output voltage, by selectively operating the set of switches based on the respective drive signal; and
    selectively changing one of a respective resistance and a respective current of a subset of the gate drive circuits based on the output state of the phase-leg.

16. The method of claim 15, wherein the selectively changing one of a respective resistance and a respective current of the subset of the gate drive circuits results in a change to a switching speed of a corresponding subset of switches.

17. The method of claim 15, wherein the selectively changing a respective resistance of the subset of the gate drive circuits comprises selectively operating a respective speed control switch in a respective gate drive circuit of the subset of the gate drive circuits to one of increase or decrease the resistance of the respective gate drive circuit.

18. The method of claim 15, wherein switchably transitioning an output state of the phase-leg between the neutral state and the positive state further includes selectively operating the set of switches based on the respective drive signal to transition from the neutral state to a first intermediate neutral state, and from the first intermediate neutral state to the positive state.

19. The method of claim 18, wherein transitioning from the neutral state to a first intermediate neutral state, and from the first intermediate neutral state to the positive state operably reduces voltage stress across at least a subset of the switches.

20. The method of claim 18, wherein switchably transitioning an output state of the phase-leg between the neutral state and the negative state further includes selectively operating the set of switches based on the respective drive signal to transition from the neutral state to a second intermediate neutral state, and from the second intermediate neutral state to the negative state.

* * * * *